(12) United States Patent
Takasu

(10) Patent No.: US 8,283,725 B2
(45) Date of Patent: Oct. 9, 2012

(54) SEMICONDUCTOR DEVICE

(75) Inventor: Hiroaki Takasu, Chiba (JP)

(73) Assignee: Seiko Instruments, Inc., Chiba (JP)

( * ) Notice: Subject to any disclaimer, the term of this patent is extended or adjusted under 35 U.S.C. 154(b) by 211 days.

(21) Appl. No.: 12/191,674

(22) Filed: Aug. 14, 2008

(65) Prior Publication Data

US 2009/0050967 A1    Feb. 26, 2009

(30) Foreign Application Priority Data

Aug. 22, 2007   (JP) ................... 2007-215948

(51) Int. Cl.
*H01L 23/62*    (2006.01)
(52) U.S. Cl. ............. 257/355; 257/356; 257/E29.266
(58) Field of Classification Search .......... 257/355, 257/356, 357, E29.266
See application file for complete search history.

(56) References Cited

U.S. PATENT DOCUMENTS

2006/0284258 A1* 12/2006 Huang et al. ............... 257/356

FOREIGN PATENT DOCUMENTS

JP    2002-231886 A    8/2002

* cited by examiner

*Primary Examiner* — Phat X Cao
*Assistant Examiner* — Nga Doan
(74) *Attorney, Agent, or Firm* — Brinks Hofer Gilson & Lione

(57) ABSTRACT

In a semiconductor device including an n-type metal oxide semiconductor transistor for electrostatic discharge protection surrounded by a shallow trench for device isolation, in order to suppress the off-leak current in an off state, there is formed, in the vicinity of the drain region of the NMOS transistor for ESD protection, an n-type region receiving a signal from an external connection terminal via a p-type region in contact with the drain region of the NMOS transistor for ESD protection.

8 Claims, 2 Drawing Sheets

SEMICONDUCTOR DEVICE

This application claims priority under 35 U.S.C. §119 to Japanese Patent Application No. JP2007-215948 filed on Aug. 22, 2007, the entire content of which is hereby incorporated by reference.

BACKGROUND OF THE INVENTION

1. Field of the Invention

The present invention relates to a semiconductor device including a metal oxide semiconductor (MOS) transistor. In particular, the present invention relates to a semiconductor device including an n-type MOS (NMOS) transistor isolated by a shallow trench structure as an electrostatic discharge (hereinafter, referred to as ESD) protective element.

2. Description of the Related Art

In a semiconductor device including MOS transistors, an off transistor, which is an NMOS transistor provided in an off-state whose gate potential is fixed to a ground (Vss), is used as an ESD protection element for preventing breakdown of an internal circuit due to static electricity supplied from a pad provided for external connection.

Since the off transistor must flow a large amount of current generated by static electricity at once unlike ordinary MOS transistors forming an internal circuit such as a logic circuit, a large width (width W) of about several hundred micrometers is required for the transistor in many cases.

Though the gate potential of the off transistor is fixed to Vss to hold the off transistor in an off-state, the threshold voltage is less than 1 V as in the NMOS transistors constituting the internal circuit, permitting generation of subthreshold current to some extent. The width W of the off transistor is large as described above, and thus an off-leak current at standby during operation becomes larger, which leads to a problem of increase in the current consumption at standby during operation of the entire integrated circuit (IC) carrying the off transistor.

In particular, in the case of a semiconductor device in which a shallow trench is used for device isolation, there is a problem, in that an area adjacent to the shallow trench includes a region such as a crystal defect layer or the like which easily generates leak current, arising from the structure itself or a manufacturing method thereof, and hence it is difficult to reduce the off-leak current of the off transistor.

As a measure to reduce the leak current of the protection element, it is proposed to provide a plurality of transistors between the power line (Vdd) and the ground (Vss) so as to completely cut the current path therebetween (for example, see FIG. 1 of JP 2002-231886 A).

However, when the width W is made small to reduce the off-leak current of the off transistor, protection function cannot be sufficiently implemented. Besides, in a semiconductor device in which a plurality of transistors are provided to cut the current path between the power line (Vdd) and the ground (Vss) as proposed in JP 2002-231886 A, an occupation area thereof increases because the semiconductor device includes the plurality of transistors, leading to an increase in cost for the semiconductor device.

SUMMARY OF THE INVENTION

In order to solve the aforementioned problems, a semiconductor device according to the present invention is structured as follows.

In the semiconductor device including an n-type metal oxide semiconductor transistor for electrostatic discharge protection surrounded by a shallow trench for device isolation, the n-type metal oxide semiconductor transistor for electrostatic discharge protection being formed between an external connection terminal and an internal circuit region so that an internal element formed in the internal circuit region is protected from electrostatic discharge breakdown, the n-type metal oxide semiconductor transistor for electrostatic discharge protection includes an n-type region, the n-type region placed on a side of the drain region of the n-type metal oxide semiconductor transistor for electrostatic discharge protection opposite to the gate electrode in a separated manner from the drain region by the p-type region in contact with the drain region and receiving a signal from the external connection terminal.

Further, the p-type region in contact with the drain region of the NMOS transistor for ESD protection is formed with such a width that allows the n-type region receiving a signal from the external connection terminal to be conducted with the drain region of the NMOS transistor for ESD protection through punch-through when a voltage of equal to or more than a supply power voltage of the semiconductor device is applied to the n-type region receiving a signal from the external connection terminal.

Further, the n-type region receiving a signal from the external connection terminal is formed in a shape of being enclosed by the drain region of the NMOS transistor for ESD protection via the p-type region.

Through the means as described above, there can be obtained a semiconductor device including an NMOS transistor for ESD protection provided with a sufficient ESD protection function while keeping the off-leak current small by preventing the generation of the leak current characteristic to the shallow trench isolation structure or by avoiding a region which generates leak current, without increasing manufacturing steps or an occupation area thereof.

DETAILED DESCRIPTION OF THE PREFERRED EMBODIMENTS

First Embodiment

Figure 1:
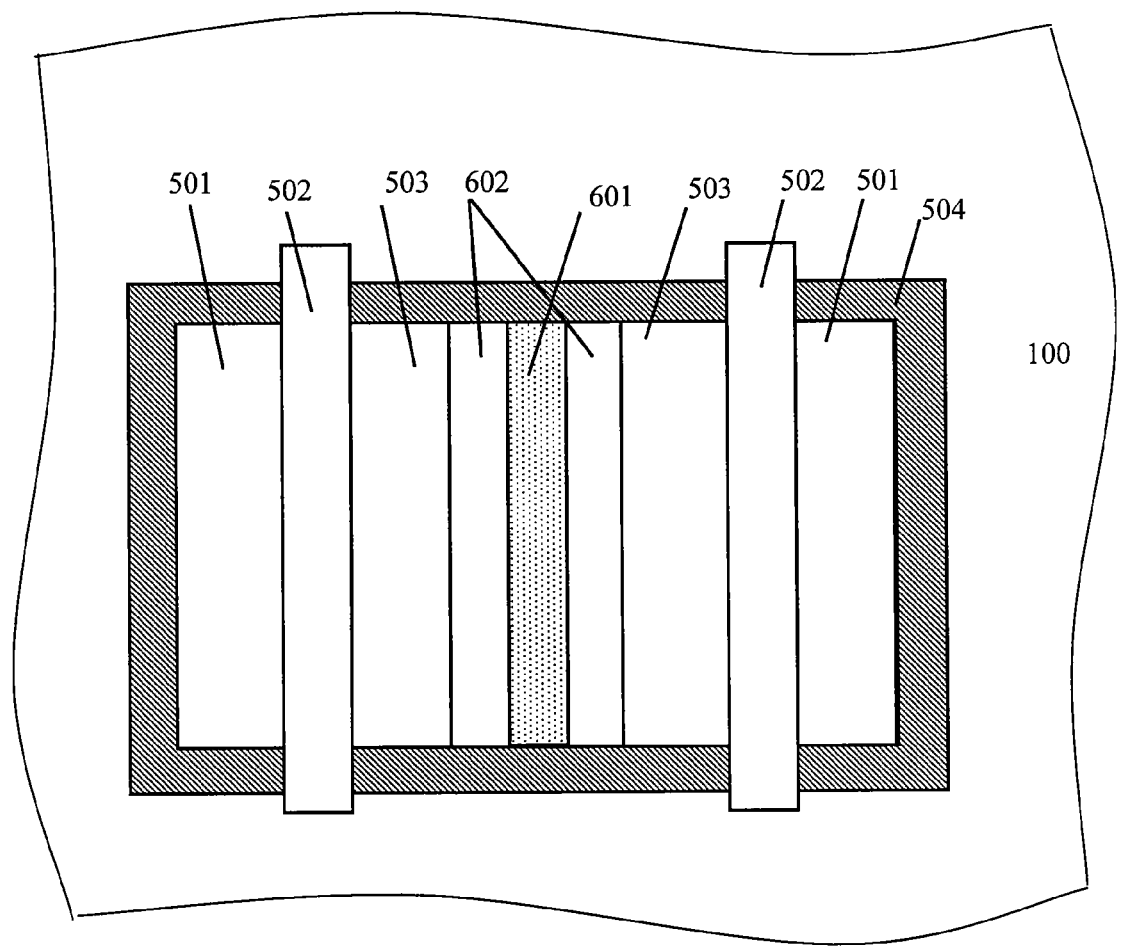
FIG. 1 is a schematic plan view showing an NMOS transistor for ESD protection of a semiconductor device according to a first embodiment of the present invention.

FIG. 1 is a schematic plan view showing an NMOS transistor for ESD protection of a semiconductor device according to a first embodiment of the present invention.

A pair of a source region 501 and a drain region 503 which are formed of an n-type heavily-doped impurity region are arranged on a p-type semiconductor substrate, a gate insulating film (not shown) made of a silicon oxide film or the like is placed between the source region 501 and the drain region 503, and a gate electrode 502 made of a polysilicon or the like is formed on an upper surface of the gate insulating film. A shallow trench structure is used for insulation from other elements, and a perimeter of the transistor is surrounded by a shallow trench isolation region 504.

In the embodiment of FIG. 1, two gate electrodes 502, and two pairs of the source region 501 and the drain region 503 each placed on either side of the gate electrode 502, are shown. In the vicinity of the drain regions 503, there is formed an n-type region 601 receiving a signal from an external connection terminal via p-type regions 602 being in contact with the drain regions 503. In this case, the p-type region 602 is formed with such a width that allows conduction through punch-through between the n-type region 601 receiving a signal from the external connection and the drain regions 503 when a voltage exceeding the power supply voltage of the semiconductor device is applied to the n-type region 601. In this embodiment, two NMOS transistors for ESD protection are symmetrically provided with the n-type region 601 being a center thereof. It is also possible to provide only one NMOS transistor for ESD protection without symmetry.

Appropriately combining a p-type impurity concentration in the p-type region 602 and a width of the p-type region 602, punch-through between the n-type region 601 receiving a signal from the external connection terminal and the drain region 503 can be made at a desired applied voltage. Selecting the width of the p-type region 602 as described above, in the state where a signal of a voltage not higher than the power supply voltage is applied to the external terminal during a normal operation of the semiconductor device, the n-type region 601 and the drain region 503 are electrically separated by the p-type region 602 of opposite conductivity. Accordingly, the signal (voltage) applied to the external terminal is not transmitted to the drain region 503 of the NMOS transistor for ESD protection, permitting essential prevention of the generation of an off-leak current of the NMOS transistor for ESD protection.

On the other hand, application of a large voltage (for example, electrostatic pulse) to the external connection terminal starts conduction initiated by punch-through between the n-type region 601 receiving a signal from the external connection terminal and the drain region 503, inducing a bipolar action of the NMOS transistor for ESD protection to sufficiently implement the protection function to the internal circuit elements.

Second Embodiment

Figure 2:
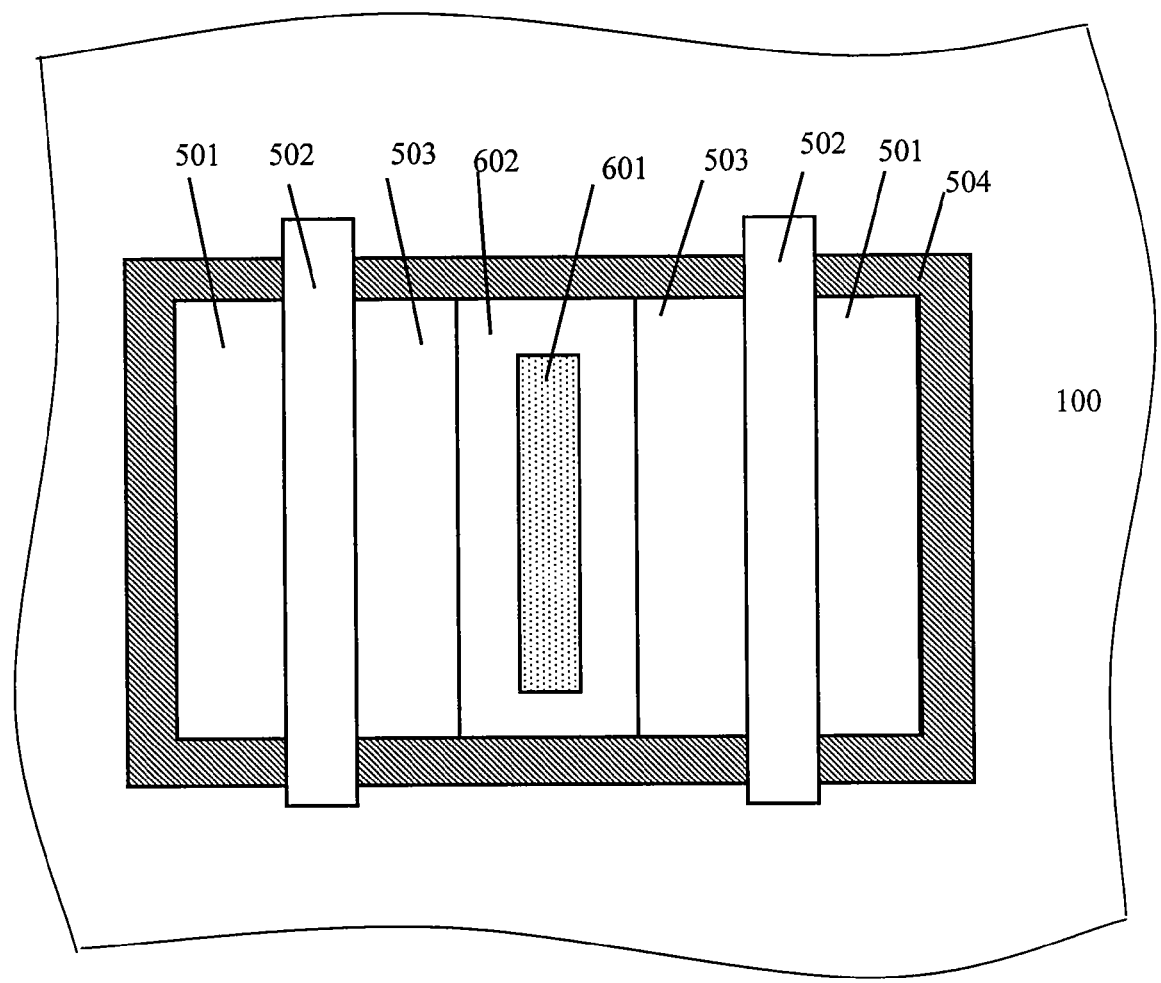
FIG. 2 is a schematic plan view showing an NMOS transistor for ESD protection of a semiconductor device according to a second embodiment of the present invention.

FIG. 2 is a schematic plan view showing an NMOS transistor for ESD protection of a semiconductor device according to a second embodiment of the present invention. The second embodiment is different from the first embodiment shown in FIG. 1 in that the n-type region 601 receiving a signal from the external connection terminal is wholly enclosed by the p-type region 602.

With this structure, the n-type region 601 receiving a signal from the external connection terminal has no portion in contact with the shallow trench isolation region 504, and thus there is no fear of a leak current in a portion adjacent to the shallow trench isolation region 504, which can be more effective at preventing the generation of the leak current compared with the first embodiment shown in FIG. 1. Other parts are denoted by the same reference numerals as FIG. 1, and thus their descriptions are omitted.

The embodiments of FIG. 1 and FIG. 2 show examples of the NMOS transistor for ESD protection having a conventional structure for simplicity, but the present invention is not limited thereto. It is needless to say that the present invention can be easily implemented by using a transistor structure such as a lightly doped drain (LDD) structure or an offset drain structure in which the drain region 503 is apart from the gate electrode 502 with a certain width.

What is claimed is:

1. A semiconductor device, comprising:
    an n-type metal oxide semiconductor transistor for electrostatic discharge protection disposed on a semiconductor substrate, placed between an external connection terminal and an internal circuit region so that an internal element disposed in the internal circuit region is protected from electrostatic discharge breakdown;
    a p-type region disposed on the semiconductor substrate in contact with a side of a drain region of the n-type metal oxide semiconductor transistor that is opposite to a gate electrode of the n-type metal oxide semiconductor transistor, the drain region is between the gate electrode and the p-type region;
    an n-type region placed apart from the drain region opposite to the gate electrode of the n-type metal oxide semiconductor transistor, fully isolated from the drain region by the p-type region, having no connection to the drain region through another n-type region, and configured to receive a signal from the external connection terminal; and
    a shallow trench region surrounding the n-type metal oxide semiconductor transistor, the p-type region, and the n-type region for isolation.

2. A semiconductor device according to claim 1, wherein the p-type region has such a width that allows conduction initiated by punch-through between the n-type region and the drain region when a voltage higher than a power supply voltage of the semiconductor device is applied to the n-type region.

3. A semiconductor device according to claim 1, wherein the n-type region is wholly enclosed by the p-type region.

4. A semiconductor device according to claim 1, wherein a plurality of the n-type metal oxide semiconductor transistors for electrostatic discharge protection are symmetrically disposed against the n-type region being a center.

5. A semiconductor device according to claim 1, wherein the n-type metal oxide semiconductor transistor for electrostatic discharge protection is an n-type metal oxide semiconductor having a lightly doped drain structure.

6. A semiconductor device according to claim 1, wherein the n-type metal oxide semiconductor transistor for electrostatic discharge protection is an n-type metal oxide semiconductor transistor having an offset drain structure.

7. A semiconductor device, comprising:
    a first and a second n-type metal oxide semiconductor transistor for electrostatic discharge protection disposed on a semiconductor substrate;
    a first p-type region disposed on the semiconductor substrate in contact with a side of a drain region of the first n-type metal oxide semiconductor transistor that is opposite to a gate electrode of the first n-type metal oxide semiconductor transistor;
    a second p-type region disposed on the semiconductor substrate in contact with a side of a drain region of the second n-type metal oxide semiconductor transistor that is opposite to a gate electrode of the second n-type metal oxide semiconductor transistor; and
    an n-type region between the first and second p-type regions, fully isolated from the drain regions of each of the first and second n-type regions of each of the first and second n-type metal oxide semiconductor transistors, and having no connection to the drain regions through another n-type region, and configured to receive a signal from the external connection terminal.

8. The semiconductor device of claim 7, further comprising a shallow trench region surrounding the first and second n-type metal oxide semiconductor transistors, the first and second p-type regions, and the n-type region for isolation.

* * * * *